US007826693B2

(12) United States Patent
Agashe et al.

(10) Patent No.: US 7,826,693 B2
(45) Date of Patent: Nov. 2, 2010

(54) MONOLITHICALLY INTEGRATED RECONFIGURABLE OPTICAL ADD-DROP MULTIPLEXER

(75) Inventors: Shashank S. Agashe, Mountain View, CA (US); Kuen-Ting R. Shiu, Ann Arbor, MI (US); Stephen R. Forrest, Ann Arbor, MI (US)

(73) Assignee: The Trustees of Princeton University, Princeton, NJ (US)

( * ) Notice: Subject to any disclaimer, the term of this patent is extended or adjusted under 35 U.S.C. 154(b) by 573 days.

(21) Appl. No.: 11/925,521

(22) Filed: Oct. 26, 2007

(65) Prior Publication Data

US 2008/0219662 A1    Sep. 11, 2008

Related U.S. Application Data

(60) Provisional application No. 60/854,514, filed on Oct. 26, 2006.

(51) Int. Cl.
*G02B 6/12* (2006.01)
*H04J 14/00* (2006.01)
*H04J 14/02* (2006.01)

(52) U.S. Cl. .............................. 385/14; 385/15; 385/24; 385/31; 385/42; 385/129; 385/130; 385/131; 385/140; 398/48; 398/83

(58) Field of Classification Search .................... 385/14, 385/15, 16, 17, 18, 24, 25, 26, 27, 28, 31, 385/37, 42, 43, 44, 45, 129, 130, 131, 132, 385/140; 398/42, 48, 79, 82, 83, 91, 92, 398/87
See application file for complete search history.

(56) References Cited

U.S. PATENT DOCUMENTS 5,039,189 A    8/1991   Kytel et al. ..................... 385/2

(Continued)

FOREIGN PATENT DOCUMENTS

CA    2408768 A1    11/2002

(Continued)

OTHER PUBLICATIONS

Agashe, et al., "Compact polarization-insensitive InGaAsP-InP 2×2 optical switch," IEEE Photonics Technology Letters, 2005, 17, 52-54.

(Continued)

*Primary Examiner*—Brian M Healy
(74) *Attorney, Agent, or Firm*—Woodcock Washburn LLP

(57) ABSTRACT

A reconfigurable optical add-drop multiplexer comprises a first waveguide layer having formed therein a first multiplexer-demultiplexer, a second multiplexer-demultiplexer, and a plurality of optical switches. The reconfigurable optical add-drop multiplexer further comprises a second waveguide layer optically coupled to the first waveguide and having a second effective index of refraction, said second waveguide layer having an optical amplifier formed therein. An input signal is amplified by the optical amplifier and communicated to the first optical multiplexer-demultiplexer where the signal is demultiplexed into a plurality individual wavelength signals. The second optical multiplexer-demultiplexer is adapted to receive a multiplexed add signal and to demultiplex the add signal into component wavelength signals. The individual wavelength signals are received at the optical switches and selectively routed to either an optical detector or toward the first multiplexer-demultiplexer. The individual wavelength signals received at the first multiplexer-demultiplexer are multiplexed into an output signal.

25 Claims, 7 Drawing Sheets

U.S. PATENT DOCUMENTS

| | | | |
|---|---|---|---|
| 5,078,516 A | 1/1992 | Kapon et al. | 385/129 |
| 5,134,671 A | 7/1992 | Koren et al. | 385/14 |
| 5,140,149 A | 8/1992 | Sakata et al. | 250/211 |
| 5,208,878 A | 5/1993 | Thulke | 385/14 |
| 5,262,656 A | 11/1993 | Blondeau et al. | 257/80 |
| 5,315,129 A | 5/1994 | Forrest et al. | 257/21 |
| 5,325,379 A | 6/1994 | Amann | 372/20 |
| 5,355,386 A | 10/1994 | Rothman et al. | 372/50 |
| 5,499,259 A | 3/1996 | Makita | 372/45 |
| 5,500,867 A | 3/1996 | Krasulick | 372/38 |
| 5,509,094 A | 4/1996 | Minami et al. | 385/29 |
| 5,511,084 A | 4/1996 | Amann | 372/20 |
| 5,568,311 A | 10/1996 | Matsumoto | 359/344 |
| 5,574,742 A | 11/1996 | Ben-Michael et al. | 372/45 |
| 5,623,363 A | 4/1997 | Liou | 359/344 |
| 5,663,824 A | 9/1997 | Koch et al. | 359/184 |
| 5,707,745 A | 1/1998 | Forrest et al. | 428/432 |
| 5,708,671 A | 1/1998 | Siao et al. | 372/20 |
| 5,715,268 A | 2/1998 | Lang et al. | 372/50 |
| 5,721,750 A | 2/1998 | Kwon et al. | 372/44 |
| 5,805,751 A * | 9/1998 | Kewitsch et al. | 385/43 |
| 5,852,687 A | 12/1998 | Wickham | 385/14 |
| 5,859,866 A | 1/1999 | Forrest et al. | 372/50 |
| 5,874,219 A | 2/1999 | Rava et al. | 435/6 |
| 5,875,272 A * | 2/1999 | Kewitsch et al. | 385/37 |
| 5,917,967 A | 6/1999 | Dubey et al. | 385/14 |
| 5,985,685 A | 11/1999 | Lealman et al. | 438/31 |
| 5,998,803 A | 12/1999 | Forrest et al. | 257/40 |
| 6,031,851 A | 2/2000 | Shimizu et al. | 372/18 |
| 6,051,445 A | 4/2000 | Dubey et al. | 438/31 |
| 6,111,903 A | 8/2000 | Isaksson et al. | 372/43 |
| 6,167,073 A | 12/2000 | Botez et al. | 372/46 |
| 6,198,863 B1 | 3/2001 | Lealman et al. | 385/37 |
| 6,215,295 B1 | 4/2001 | Smith, III | 324/95 |
| 6,240,233 B1 | 5/2001 | Weinert et al. | 385/131 |
| 6,246,965 B1 | 6/2001 | Cockerham et al. | 702/85 |
| 6,310,995 B1 | 10/2001 | Saini et al. | 385/28 |
| 6,311,003 B1 | 10/2001 | Dubey et al. | 385/130 |
| 6,314,117 B1 | 11/2001 | Heim et al. | 372/43 |
| 6,314,451 B1 | 11/2001 | Landsman et al. | 709/203 |
| 6,330,378 B1 | 12/2001 | Forrest et al. | 385/14 |
| 6,330,387 B1 | 12/2001 | Salamon et al. | 385/129 |
| 6,330,389 B1 | 12/2001 | Daoud et al. | 385/135 |
| 6,335,994 B1 | 1/2002 | Kato | 385/50 |
| 6,339,496 B1 | 1/2002 | Koley et al. | 359/344 |
| 6,381,380 B1 | 4/2002 | Forrest et al. | 385/14 |
| 6,483,863 B2 | 11/2002 | Forrest et al. | 372/50 |
| 6,490,044 B1 | 12/2002 | Koch et al. | 356/478 |
| 6,519,374 B1 | 2/2003 | Stook et al. | 385/2 |
| 6,539,150 B2 * | 3/2003 | van Weerden et al. | 385/39 |
| 6,665,476 B2 * | 12/2003 | Braun et al. | 385/50 |
| 6,668,103 B2 | 12/2003 | Hosoi | 385/2 |
| 6,671,300 B2 | 12/2003 | Marsh et al. | 372/45 |
| 6,795,622 B2 | 9/2004 | Forrest et al. | 385/50 |
| 6,819,814 B2 | 11/2004 | Forrest et al. | 385/14 |
| 6,984,538 B2 | 1/2006 | Ooi et al. | 438/22 |
| 6,989,286 B2 | 1/2006 | Hamilton et al. | 438/36 |
| 7,110,170 B2 | 9/2006 | Lee et al. | 359/344 |
| 7,230,963 B2 | 6/2007 | Menon et al. | 372/50.21 |
| 7,251,407 B2 | 7/2007 | Najda | 385/131 |
| 7,302,124 B2 | 11/2007 | Forrest et al. | 385/14 |
| 7,343,061 B2 * | 3/2008 | Forrest et al. | 385/14 |
| 7,532,784 B2 * | 5/2009 | Tolshikhin et al. | 385/14 |
| 2002/0018504 A1 | 2/2002 | Coldren | 372/50 |
| 2002/0031297 A1 | 3/2002 | Forrest et al. | 385/28 |
| 2002/0097941 A1 | 7/2002 | Forrest et al. | 385/1 |
| 2003/0012244 A1 | 1/2003 | Krasulick et al. | 301/37.101 |
| 2003/0141511 A1 | 7/2003 | Marsh et al. | 257/98 |
| 2004/0096175 A1 | 5/2004 | Tolstikhin | 385/131 |
| 2006/0226285 A1 | 10/2006 | Matsui | 244/99.6 |
| 2008/0219662 A1 * | 9/2008 | Agashe et al. | 398/48 |

FOREIGN PATENT DOCUMENTS

| | | |
|---|---|---|
| CA | 2335942 C | 12/2007 |
| CN | 1118527 | 3/1996 |
| DE | 60212344 T2 | 10/2007 |
| DE | 60123427 T2 | 2/2008 |
| EP | 0263640 B1 | 1/1993 |
| FR | 2337449 | 7/1977 |
| GB | 2105863 A | 3/1993 |
| JP | 2000228558 A | 8/2000 |
| WO | 9967665 A1 | 12/1999 |
| WO | 0188577 A1 | 11/2001 |
| WO | 02058251 A3 | 7/2002 |
| WO | 03007057 A3 | 1/2003 |
| WO | 03102678 A1 | 12/2003 |
| WO | 2007099421 A2 | 12/2007 |

OTHER PUBLICATIONS

Xia, F., et al., "Monolithic integration of a semiconductor optical amplifier and a high bandwidth p-i-n photodiode using asymmetric twin-waveguide technology," IEEE Photonics Technology Letters, 2003, 15, 425-454.

Menon, V.M., et al., "Photonic integration using asymmetric twin-waveguide (ATG) technology: part II—devices," IEEE J. of Selected Topics in Quantum Electronics, 2005, 11, 30-42.

Xia, F., et al., "Photonic integration using asymmetric twin-waveguide (ATG) technology: part I—concepts and theory," IEEE J. of Selected Topics in Quantum Electronics, 2005, 11, 17-29.

Shiu, K.-T., et al., "A simple, monolithically integrated optical receiver consisting of an optical preamplifier and a p-i-n photodiode," IEEE Photonics Technology Letters, 2006.

Alferness, R.C., et al., "Vertically coupled INGAASP/INP buried rib waveguide filter," Applied Physics Letts., 1991, 59(20), 2573-2575.

Bach, L., et al., "Wavelength stabilized single-mode lasers by coupled micro-square resonators," IEEE Photonics Techn. Letts., 2003, 15, 377-379.

Bauer, J.G., et al., "High responsivity integrated tapered waveguide PIN photodiode," Proceedings fo the European Conference on Optical Communication (ECOC), Sep. 12-16, 1993, vol. 2, Conf. 19, 277-280.

Bennett, S., et al., "1.8-THz bandwidth, zero-frequency error, tunable optical comb generator for DWDM applications," IEEE Photonics Techn. Letts., 1999, 11(5), 551-553.

Bruckner, H.J., et al., "Taper-Waveguide integration for polarization insensitive InP/InGaAsP based optical amplifiers," Electron. Lett., 1994, 30(16), 1290-1291.

Claasen, A., et al., "Comparison of diodes and resistors for measuring chip temperature during thermal characterization of electronic packages using thermal test chips," IEEE 13th Ann. Semiconductor Thermal Measurement & Management Symposium, 1997, 198-209.

"Coupled cavity modelocked lasers," Applied Physics, http://fb6www.uni-paderborn.de, downloaded Mar. 30, 2005, 3 pages.

"Current work on composite-resonator vertical-cavity lasers," Coupled Cavity VCSELs, http://vcsel.micro.uiuc.edu, downloaded Mar. 30, 2005, 4 pages.

Dagenais, M., et al., "Alignment tolerant lasers and silicon waferboard integration," Passive Alignment Techniques for Optoelectronic Transmitter Arrays, http: www.ee.umd.edu/photonics/papers/spie/SPIE97.htm, 1997, 14 pages.

Dagenais, M., et al., "Complex needs drive optoelectronic integration," Optoelectronics World, Jul. 1998, 157-160.

De Besten, J.H., et al., "An integrated coupled-cavity 16-wavelength digitally tunable laser," IPR, 2002, 1-3.

Forrest, S.R., et al., "Integrated photonics using asymmetric twin-waveguide structures," IEEE, 2000, 13-16.

Fredkin, E., "Conservative Logic," Int. J. Theor. Phys., 1982, 21(3/4), 219-253.

Gokhale, M.R., et al., "Uncooled, 10Gb/s 1310 nm electroabsorption modulated laser," presented at OFC 2003 (PD-42), Atlanta, USA, 2003, 4 pages.

Hamamoto, et al., "Insertion-loss-free 2×2 InGaAsP/InP optical switch fabricated using bandgap energy controlled selective MOVPF," Electron. Lett., 1995, 31(20), 1779-1781.

Hammond, B., et al., "Integrated wavelength locker for turnable laser applications," 15th Ann. Meeting of the IEEE Lasers & Electro-Optics Soc., 2002, 2, 479-480.

He, J.-J., et al., "Photonic integrated circuits and components using quantum well intermixing," Integrated Optoelectronics, Proc. of SPIE, 1996, 2891, 2-9.

Huang, Y., et al., "Reduction of absorption loss in asymmetric twin waveguide laser tapers using argon plasma-enhanced quantum-well intermixing," IEEE Photonics Techn. Letts., 2004, 16(10), 2221-2223.

Johnson, J.E., et al., "Fully stabilized electroabsorption-modulated tunable DBR laser transmitter for long-haul optical communications," IEEE J. on Selected Topics in Quantum Electronics, 2001, 7, 168-177.

Kanjamala, A.P., et al., "Wavelength switching in multicavity lasers," Am. Inst. Of Physics, 1997, 71(3), 300-302.

Newkirk, M.A, et al., "1.55 µm multiquantum well semiconductor optical amplifier with low gain ripple and high coupling efficiency for photonic circuit integration," Electron. Lett., 1993, 29(5), 443-444.

O'Dowd, R., et al., "Frequency plan and wavelength switching limits for widely tunable semiconductor transmitters," IEEE J. Selected Topics in Quantum Electrons, 2001, 7, 259-269.

Oh., K.R., et al., "Laser amplifier gate switch arrays using reactive ion etching," Electron. Lett., 1996, 32(1), 39-40.

Rabus, D.G., et al., "MMI-coupled ring resonators in GaInAsP-InP," IEEE Photonics Techn. Letts., 2001, 13, 812-814.

Rabus, D.G., et al., "Resonance frequency tuning of a double ring resonator in GaInAsP/InP: Experiment and simulation," Jpn. J. Appl. Phys., 2002, 41, 1186-1189.

Rabus, D.G., et al., "High-Q channel-dropping filters using ring resonators with integrated SOAs," IEEE Photonics Techn. Letts., 2002, 1, 1442-1444.

Saini, S.S., et al., "Compact mode expanded lasers using resonant coupling between a 1.55-µm InGaAsP tapered active region and an underlying coupling waveguide," IEEE Photonics Technology Letters, Sep. 1998, 10(9), 1232-1234.

Saini, S.S., et al., "Compact low-loss vertical resonant mode coupling between two well-confined waveguides," Electronics Letts., 1999, 35(14), 2 pages.

Saini, S.S., et al., "Passive active resonant coupler (PARC) platform with mode expander," IEEE Photonics Techn. Letts., 2000, 12(8), 1025-1027.

Sarlet, G., et al., "Control of widely tunable SSG-DBR lasers for dense wavelength division multiplexing," IEEE J. Lightwave Techn., 2000, 18, 1128-1138.

Shi, H., et al., "Relative intensity noise measurements of a widely tunable sampled-grating DBR laser," IEEE Photonics Techn. Letts., 2002, 14, 759-761.

Silva, C.F.C., et al., "A dense WDM source using optical frequency comb generation and widely tunable injection-locked laser filtering techniques," Department of Electrical Engineering, 2000, 497-500.

Studenkov, P.V., et al., "Efficient Coupling in Integrated Twin-Waveguide Lasers Using Waveguide Tapers", IEEE Photonics Technology Letters, 1999, vol. 11, No. 9, pp. 1096-1098.

Studenkov, P.V., et al., "Asymmetric Twin-Waveguide 1.55-µm Wavelength Laser with a Distributed Bragg Reflector", IEEE Photonics Technology Letters, 2000, vol. 12, No. 5, pp. 468-470.

Studenkov, P.V., et al., "Monolithic Integration of a Quantum-Well Laser and an Optical Amplifier Using an Asymmetric Twin-Waveguide Structure", IEEE Photonics Technology Letters, 1998, vol. 10, No. 8, pp. 1088-1090.

Studenkov, P., et al., "Monolithic integration of an all-optical Mach-Zehnder demultiplexer using an asymmetric twin-waveguide structure," IEEE Photonics Techn. Lett., 2001, 13, 600-602.

Suematsu, Y., et al., "Integrated twin-guide AlGaAs laser with multiheterostructure," IEEE J. Quantum Electron., 1973, QE-11(7), 457-460.

Tatsuno, K., et al., "50 GHz spacing, multi-wavelength tunable locker integrated in a transmitter module with a monolithic-modulator and a DFB-laser," Optical Fiber Commun. Conf., 2001, TuB5-1-TuB5-4.

Tauke-Pedretti, A., et al., "High satuation power and high gain integrated photoreceivers," IEEE Photonics Technology Letts., 2005, 17(10), 2167-2169.

Utaka, K., et al., "Measurement of coupling coefficient and coupling length of GaAs/A1GaAs integrated twin-guide injection lasers prepared by liquid-phase epitaxy," Trans. IECE Japan, 1979, E-62, 319-323.

Van, V., et al., "Optical signal processing using nonlinear semiconductor microring resonators," IEEE J. on Selected Topics in Quantum Electronics, 2002, 8, 705-713.

Vusinkala, V., et al., "1.55- µm InGaAsP—InP laser arrays with integrated-mode expanders fabricated using a single epitaxial growth," IEEE J. Selected Topics in Quantum Electronics, Dec. 1997, 3(6), 1332-1343.

Vusinkala, V., et al., "Compact mode expanders using resonant coupling between a tapered active region and an underlying coupling waveguide," IEEE Photonics Techn. Letts., 1998, 10(2), 203-205.

Wang, H., et al., "A fully integratable, 1.55- µm wavelength, continuously tunable asymmetric twin-waveguide distributed bragg reflector laser," IEEE Photonics Techn. Lett., 2003, 15(9), 1189-1191.

Wei, J., et al., "A high-responsivity high-bandwidth asymmetric twin-waveguide coupled InGaAs-InP-InAlAs avalanche photodiode," IEEE Photonics Techn. Lett., 2002, 14, 1590-1592.

Woodward, S.L., et al., "RIN in multisection MQW-DBR lasers," IEEE Photonics Technology Letts., 1990, 2, 104-108.

Woodward, S.L., et al., "A control loop which ensures high side-mode-suppression ratio in a tunable DBR laser," IEEE Photonics Techn. Letts., 1992, 4, 417-419.

Xu, L., et al., "Monolithic integration of an InGaAsl'-InP MQW laser/waveguide using a twin-guide structure with a mode selection layer," IEEE Photon. Technol. Lett., 1997, 9, 569-571.

Yakoyama, Y., et al, "Multiwavelength locker integrated wide-band wavelength-selectable light source module," IEEE Photonics Technollogy Letts., 2003, 15, 290-292.

Benjamin, S., et al., "A short introduction to quantum-scale computing," Centre for Quantum computation, http://www.qubit.org/intros/nano/nano.html, downloaded from the internet on Jan. 26, 2001, 5 pages.

Kuhlmann, U., et al., "Terabytes, shrink-wrapped Is organic mass memory ready for series production?," Wir haben den grobten, 1998, http://www.heise.de/ct/english/98/03/018, downloaded from the internet on Jan. 26, 2001, 5 pages.

The foundation of next-generation electronics: condensed-matter physics at RLE, RLE Currents, 1998, 10(2), http://rleweb.mit.edu/Publications/currents/cur10-2.htm, downloaded from the internet on Jan. 26, 2001, 44 pages.

Kim, C., et al., "Micropatterning of organic electronic devices by cold-welding," Science, 2000, 288, 764, 831-833.

* cited by examiner

MONOLITHICALLY INTEGRATED RECONFIGURABLE OPTICAL ADD-DROP MULTIPLEXER

CROSS REFERENCE TO RELATED APPLICATIONS

The present application claims priority to U.S. Provisional Patent Application 60/854,514 filed on Oct. 26, 2006, the contents of which are hereby incorporated by reference in its entirety.

GOVERNMENT LICENSE RIGHTS

The U.S. Government may have a paid-up license in the technology disclosed herein and the right in limited circumstances to require the patent owner to license others on reasonable terms as provided for by the terms of contract number DARPA 339-6043.

FIELD OF THE APPLICATION

The present application is related to the field of optical communication devices, and more particularly to reconfigurable optical add-drop multiplexers.

BACKGROUND

Reconfigurable optical add-drop multiplexers (ROADMs) have a multitude of uses and have shown great promise for use in optical systems. For example, one promising area of application for ROADMs is in the field of wavelength division multiplexed (WDM) light wave systems. ROADMs may be used for the selective broadcasting, dropping, and monitoring of discrete wavelengths.

In the field of optical systems, photonic integrated circuits (PICs) provide an integrated technology platform increasingly used to form complex optical systems. This technology allows multiple optical devices to be integrated on a single substrate. For example, PICs may comprise integrated amplifiers, receivers, waveguides, detectors, and other active and passive optical devices arranged in various configurations.

Asymmetric twin waveguide (ATG) technology has proven to be a promising method for optoelectronic integration and offers a relatively simple fabrication process for even the most complex PIC design. The ATG design significantly reduces modal interference by substantially confining different modes of light to propagation in different waveguides. Modal confinement is accomplished by designing waveguides such that the mode of light that propagates in a waveguide has a different effective index of refraction than the mode of light that propagates in the adjacent waveguide. This feature substantially isolates the light propagating in each waveguide, which lends itself to the specialization of functions performed by the waveguides. Transfer of light between the waveguides is facilitated by lithographically defined taper couplers. The minimal modal interference and efficient coupling result in high-performance lasers, p-i-n and avalanche photodiodes, SOAs, and integrated combinations of these fundamental photonic functionalities. U.S. Pat. Nos. 6,381,380, 6,330,387, 6,483,863, 6,795,622, and 6,819,814, the contents of which are hereby incorporated herein by reference in their entirety, provide a description of ATG and various embodiments of ATG.

SUMMARY

Applicants disclose herein new and improved ROADMs. According to an aspect of an illustrative embodiment, a ROADM may be formed in a monolithic structure having asymmetric waveguide layers.

An illustrative ROADM comprises a first optical multiplexer-demultiplexer, a second optical multiplexer-demultiplexer, a plurality of switches, and at least one active optical device such as, for example, an optical amplifier, a laser, a detector, or an electrically activated optical switch. In an illustrative embodiment, an input signal is amplified by an optical amplifier and communicated to the first optical multiplexer-demultiplexer. The first optical multiplexer-demultiplexer receives the amplified input signal and demultiplexes the input signal into a plurality individual wavelength signals. The second optical multiplexer-demultiplexer is adapted to receive an add signal comprising a plurality of individual wavelength signals and to demultiplex the add signal into the component individual wavelength signals. The individual wavelength signals comprised in the input signal and the add signal are selectively dropped at the plurality of switches. After the individual wavelength signals have been added and/or dropped, the first optical multiplexer-demultiplexer is further adapted to receive the resulting plurality of individual wavelength signals, and to multiplex these plurality of individual wavelength signals into an output signal.

In an illustrative embodiment, the first optical multiplexer-demultiplexer, a second optical multiplexer-demultiplexer, and the plurality of switches are formed in a first waveguide layer. The optical amplifier, and any other active optical components, are formed in the second waveguide layer. The first waveguide layer has a first effective index of refraction and the second waveguide layer has a second effective index of refraction such that a first mode of light propagates primarily in the first waveguide layer and a second mode of light propagates primarily in a second waveguide layer in the area where the first waveguide and the second waveguide overlap.

These and other illustrative embodiments, including additional elements and features, are described below.

BRIEF DESCRIPTION OF THE DRAWINGS

The foregoing summary and the following additional description of the illustrative embodiments may be better understood when read in conjunction with the appended drawings. The potential embodiments of the disclosed systems and methods are not limited to those depicted.

In the drawings.

DETAILED DESCRIPTION OF ILLUSTRATIVE EMBODIMENTS

Monolithic integrated ROADMs may be used to drop individual wavelength signals from a multiplexed signal, as well as to add individual wavelength signals to the multiplexed signal.

Figure 1:
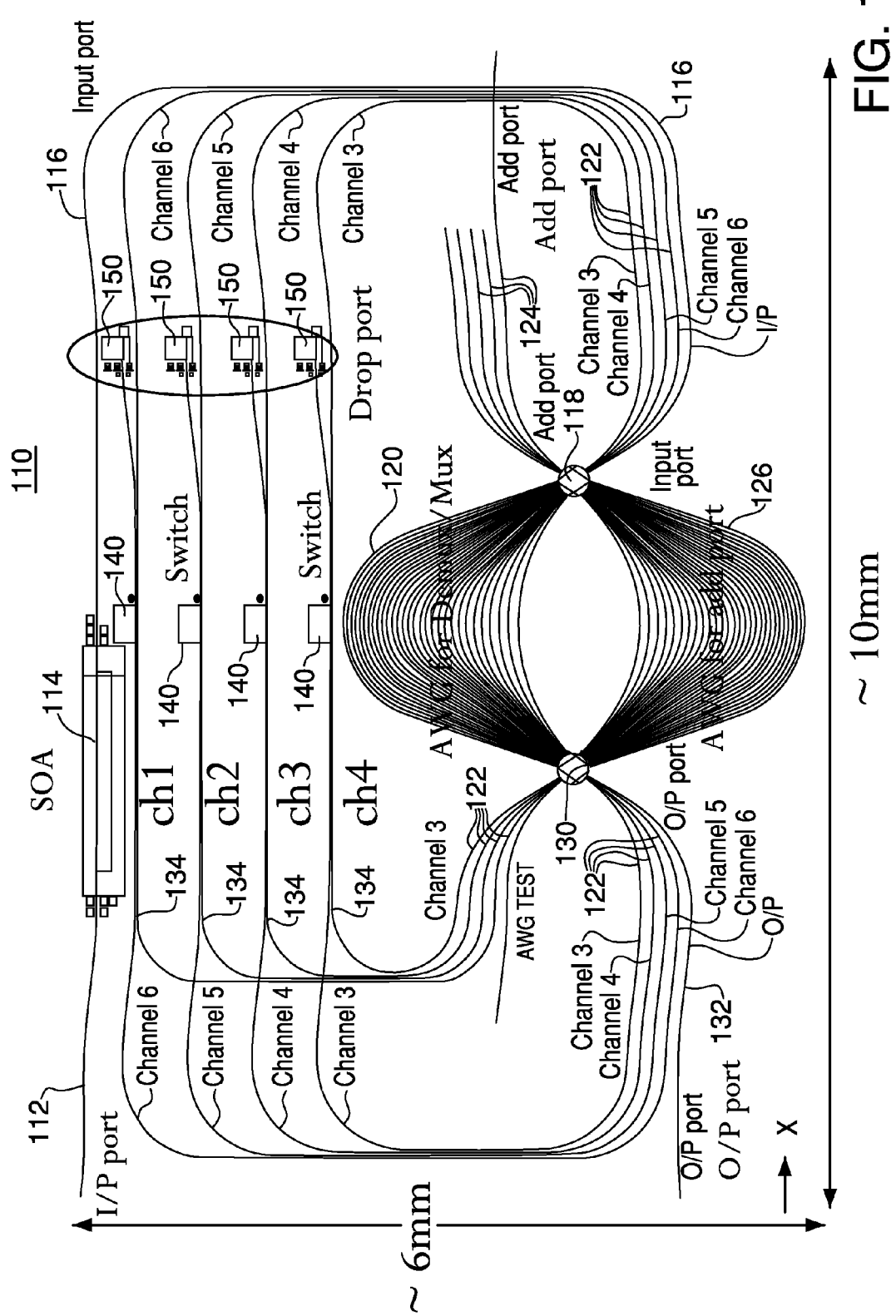
FIG. 1 is a layout view of an illustrative ROADM.

FIG. 1 provides a layout view of an illustrative monolithic integrated ROADM 110. The illustrative ROADM comprises an input waveguide or port 112 for receiving an optical input signal. The input signal may be, for example, a signal comprising a plurality of individual wavelength signals, which may be separately added and dropped via ROADM 110. As described below in connection with FIG. 2, ROADM 110 may be constructed using asymmetric waveguide layers comprising a passive waveguide layer 218 and an active waveguide layer 216. In an illustrative embodiment, input port 112 is formed in passive layer 218 of the structure.

Figure 5:
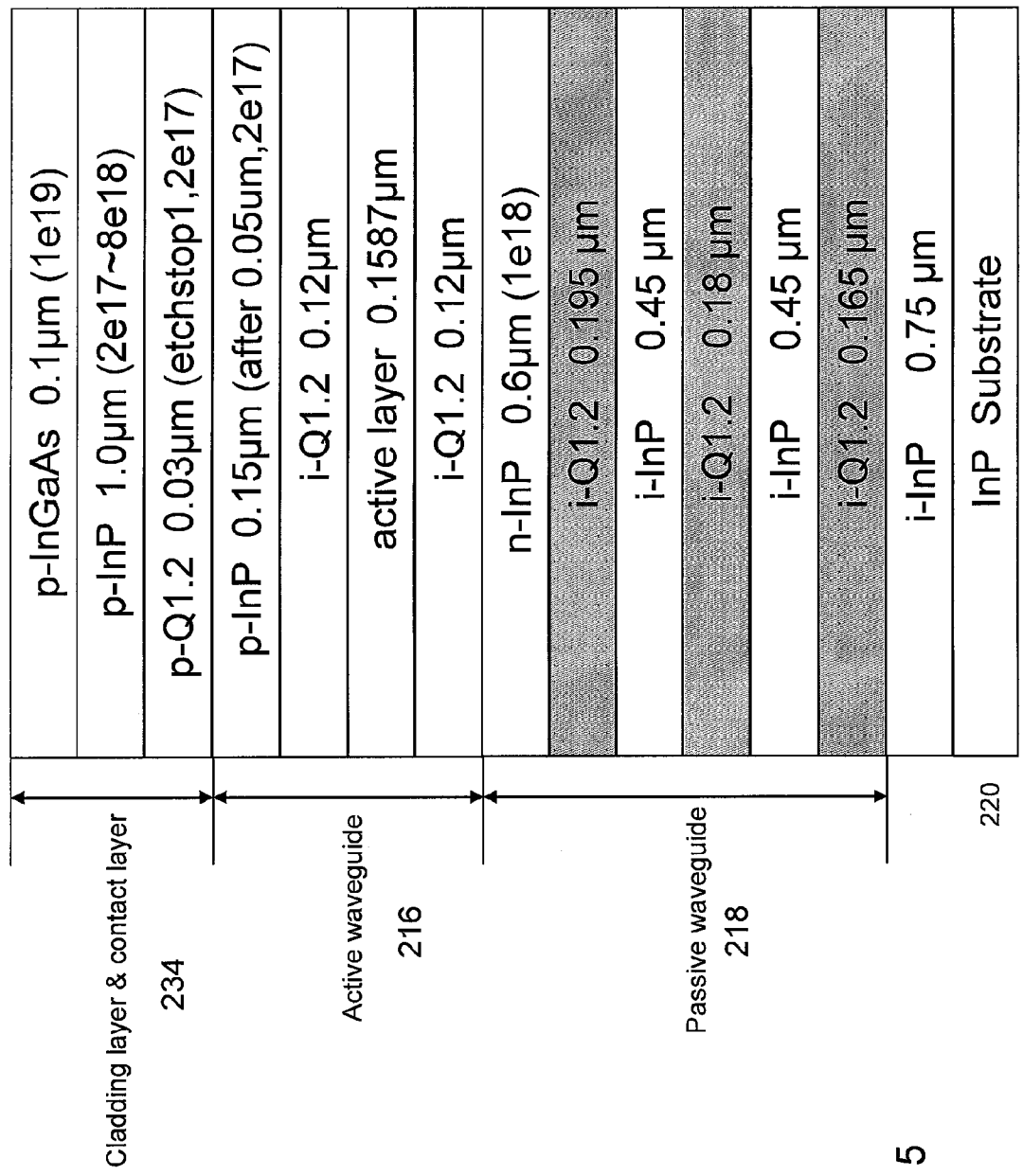
FIG. 5 depicts the layered structure diagram of an illustrative monolithic integrated ROADM.

Illustrative ROADM 110 further comprises an optical amplifier 114. Optical amplifier 114 is adapted to receive the input signal from input port 112 and amplify the signal. In an embodiment constructed using asymmetric waveguide layers comprising a passive waveguide layer and active waveguide layer as shown in FIG. 5, optical amplifier 114 is formed in active layer 216 of the structure. In the illustrative embodiment of FIG. 5, optical amplifier 114 is positioned in the circuit after input port 112. Optical amplifier 114 could alternatively be positioned anywhere in the ROADM circuit 110. Further, while only one optical amplifier 114 is depicted, a ROADM circuit 110 may comprise a plurality of optical amplifiers located throughout the circuit. Moreover, in other illustrative embodiments, one or more other optical components such as, for example, a laser, a modulator, an active ring resonator, and/or optical attenuator may appear in the circuit in the place of optical amplifier 114.

After being amplified by optical amplifier 114, the amplified input signal propagates along waveguide 116, which is formed in passive waveguide layer 218 of FIG. 5, and then on to optical coupler 118. Coupler 118 is adapted to couple light from waveguide 116 into a first multiplexer-demultiplexer 120. Coupler 118 is further adapted to couple light from a plurality of waveguides 122 for guiding individual wavelength signals into multiplexer-demultiplexer 120. Still further, coupler 118 is adapted to couple light from one or more of a plurality of add ports 124 into a second multiplexer-demultiplexer 126. Coupler 118 may be any type of optical coupler suitable for moving light from waveguides 116, 122, and 124 into multiplexer-demultiplexers 120, 126. In an illustrative embodiment, coupler 118 may be, for example, an overlap star coupler. Coupler 118 and add ports 124 may be formed in the passive waveguide layer 218 of FIG. 5.

First optical multiplexer-demultiplexer 120 is adapted to demultiplex the input signal which is received via coupler 118 from waveguide 116. Input signal may comprise a plurality of individual wavelength signals, i.e. discrete signals carried on different wavelengths of light. The number of individual wavelength signals comprised in the input signal may be one, two, three, four, or any number sufficient to carry the individual wavelength signals comprised in the input signal. Optical multiplexer-demultiplexer 120 operates to demultiplex the input signal into the separate individual wavelength signals. The individual wavelength signals are received at optical coupler 130 where each of the individual wavelength signals is coupled into one of the plurality of waveguides 122. (In the illustrative embodiment of FIG. 1, waveguides extending from the lower left side of coupler 130 carry signals from multiplexer-demultiplexer 120.) Optical multiplexer-demultiplexer 120 may be any type of device operable to multiplex and demultiplex signals as described herein, such as, for example, an array waveguide grating. In an illustrative embodiment, first optical multiplexer-demultiplexer 120 and waveguides 122 are formed in the passive waveguide layer 218 of FIG. 5.

Optical coupler 118 is also adapted to receive an add signal from add ports 124. Add signal may be a multiplexed signal comprising one or more individual wavelength signals that are meant to be multiplexed with signals comprised in the input signal. Optical coupler 118 is adapted to couple the add signal into second multiplexer-demultiplexer 126. Second multiplexer-demultiplexer 126 is adapted to demultiplex the add signal into the individual wavelength signals that may be comprised in the add signal. The demultiplexed individual wavelength signals are received at coupler 130, where they are coupled into the plurality of waveguides 122. (In the illustrative embodiment of FIG. 1, waveguides extending from the upper left side of coupler 130 carry signals from multiplexer-demultiplexer 126.) Optical multiplexer-demultiplexer 126 may be any type of device operable to multiplex and demultiplex signals as described herein, such as, for example, an array waveguide grating. In an illustrative embodiment, second optical multiplexer-demultiplexer 126 is formed in the passive waveguide layer 218 of FIG. 5.

Coupler 130 may be any type of optical coupler suitable for moving light from waveguides multiplexer-demultiplexers 120 and 126 into waveguides 122 and 132. In an illustrative embodiment, coupler 130 may be, for example, an overlap star coupler. Coupler may be formed in the passive layer 218 of the multi-layer asymmetric structure described in connection with FIG. 5.

Each of waveguides 122 carry an individual waveguide signal from multiplexer-demultiplexers 120, 126. In the embodiment shown in FIG. 1, there are four waveguides 122 shown (labeled channels 3, 4, 5, and 6) extending from each of multiplexer-demultiplexers 120 and 126. It should be appreciated that while four waveguides are illustrated, any number of waveguides 122 may be employed sufficient to carry the individual waveguide signals that are multiplexed in the input signal. Each waveguide 122 is adapted to provide a propagation path for an individual waveguide signal.

Each of waveguides 122 leading from first multiplexer-demultiplexer 120 joins with a corresponding waveguide 122 leading from second multiplexer-demultiplexer 126 at waveguide junctions 134. For each pair of waveguides 122 that is joined at a junction 134, the individual waveguide signals propagating in the respective waveguides leading from first multiplexer-demultiplexer 120 and second multiplexer-demultiplexer 126 continue to propagate as separate signals in the joined waveguide. Thus, after junction 134, a waveguide 122 may have two separate signals propagating therein—one originating from the input signal and multiplexer-demultiplexer 120, and another originating from add signal and multiplexer-demultiplexer 126. Each of waveguides 122 may have an optical amplifier formed therein which may be used for various purposes including, for example, channel equalization.

Each of plurality of waveguides 122 is communicatively coupled with an optical switch 140. Each of optical switches 140 is adapted to selectively either allow the particular individual waveguide signal in the particular waveguide 122 to continue to propagate in the waveguide where it will eventually propagate to first multiplexer-demultiplexer 120 to be combined in the output signal, or to switch the individual wavelength signal for further processing, which, in the illustrative example, is processing by optical detector 150. In an illustrative embodiment, when optical switch 140 is switched to one state, e.g., the "off-state," a signal propagating in waveguide 122 that originated from multiplexer-demultiplexer 120 continues to propagate in the circuit toward multiplexer-demultiplexer 120, and a signal propagating in the circuit that originated from multiplexer-demultiplexer 126 is routed by switch 140 to detector 150. Also, in an illustrative embodiment, when optical switch 140 is switched to another state, e.g., the "on-state," a signal propagating in waveguide 122 that originated from multiplexer-demultiplexer 120 is routed by switch 140 to detector 150, and a signal propagating in the circuit that originated from multiplexer-demultiplexer 126 continues to propagate in the circuit toward multiplexer-demultiplexer 120.

Thus, optical switches 140 may be any type of optical switch that is adapted to selectively switch an optical signal from one waveguide to one of either of two propagation paths, e.g., to detector 150 or to multiplexer-demultiplexer 120. An individual wavelength signal may be rerouted for any number of reasons such as, for example, for monitoring, processing, or simply to drop the signal from the ultimate output signal. Optical switches 140 may be any devices that is operable to provide the described functionally, and may be, for example, a switch such as that disclosed in the article titled "Compact Polarization-Insensitive InGaAsP—InP 2×2 Optical Switch," 17 *IEEE Photonics Technology Letters* 1 (January 2005), by Agashe, Shiu, and Forrest, the contents of which are hereby incorporated by reference in their entirety. In an illustrative embodiment, a portion of optical switch 140 is formed in the passive waveguide layer 218 as depicted in FIG. 5. In an embodiment, the optical switch may further comprise a portion that is formed in active waveguide layer 216 as well. For example, optical switches 140 may be an electrically activated optical switch or an optically activated optical switch which may be formed at least in part in active waveguide layer 216 as well.

Each of optical detectors 150 is adapted to detect an optical signal that has been routed to it by the corresponding optical switch 140. The individual wavelength signals that are routed to detectors 150 may be further routed for further processing. In an embodiment constructed using asymmetric waveguide layers comprising a passive waveguide layer and active waveguide layer, such as that shown in FIG. 5, detectors 150 are formed in an active layer 216 of the structure. The optical detectors 150 may be any type suitable for detecting an optical signal. The optical detector 150 may be, for example, avalanche photodetector or a uni-travelling carrier photodetector.

The individual wavelength signals that are not switched to detectors 150 continue to propagate in waveguides 122. The individual wavelength signals propagate to coupler 118, and eventually into first multiplexer-detector 120. First optical multiplexer-demultiplexer 120 is adapted to multiplex the individual wavelength signals that are received via coupler 118 from waveguides 122. First optical multiplexer-demultiplexer 120 multiplexes the individual wavelength signals into a single signal that may be referred to as an output signal. The multiplexed output signal is received at optical coupler 130 and coupled into output waveguide or port 132. The output waveguide 132 is formed in passive waveguide layer 218 of the monolithic structure.

Figure 6:
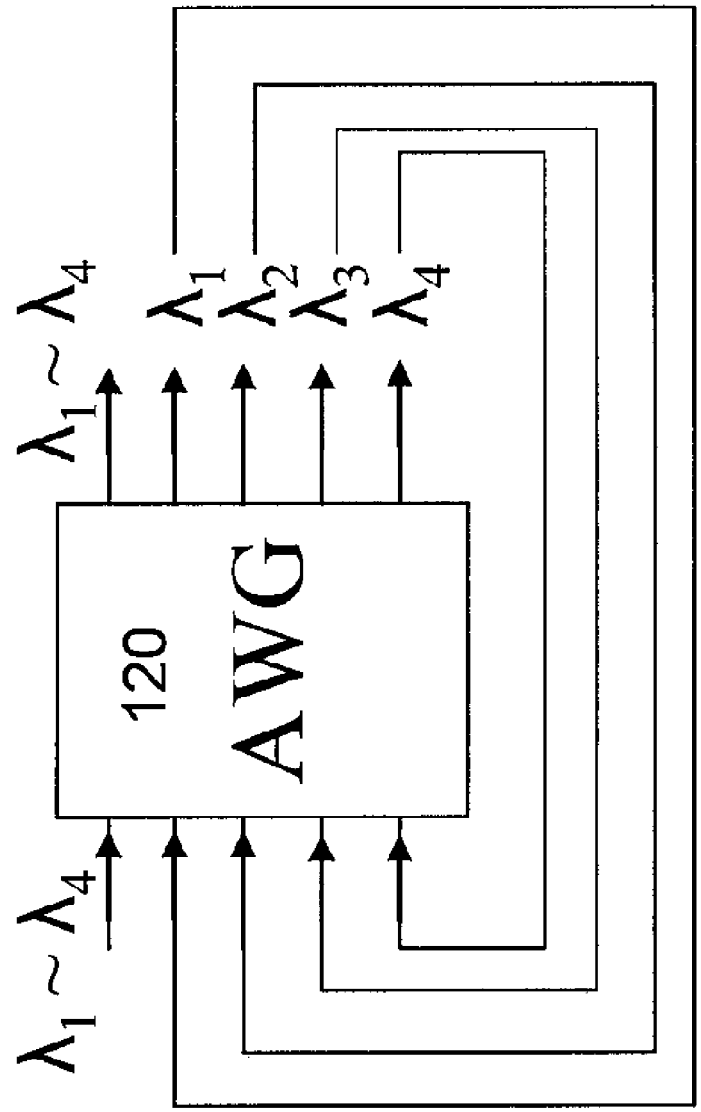
FIG. 6 is a block diagram illustrating an illustrative multiplexer-demultiplexer and waveguides.

As described above, ROADM 110 comprises a loop-back design surrounding first multiplexer-demultiplexer 120. The multiplexed input signal enters multiplexer-demultiplexer 120 and is demultiplexed into the individual wavelength signals. The individual wavelength signals propagate on waveguides 122 and may be added to and/or dropped, with the resulting signals ultimately propagating back to multiplexer-demultiplexer 120. Multiplexer-demultiplexer 120 then multiplexes the received signals into an output signal. Thus, in a disclosed embodiment, a single multiplexer-demultiplexer 120 may be used to perform both multiplexing and demultiplexing functions. This design reduces the number of optical devices and allows for a compact design. FIG. 6 is a block diagram depicting the looping structure surrounding multiplexer-demultiplexer 120.

Figure 2:
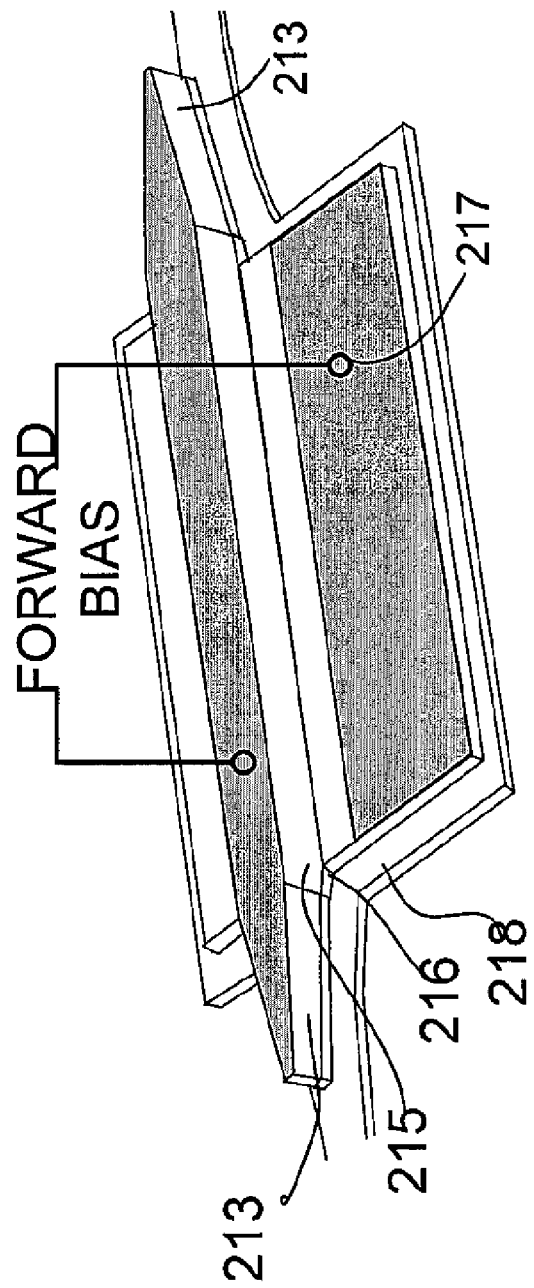
FIG. 2 is a schematic view of an illustrative monolithic integrated semiconductor optical amplifier for use in an illustrative ROADM.

Illustrative ROADM 110 comprises active devices—semiconductor optical amplifier 114 and detectors 150—and passive devices—waveguides 122, couplers 118, 130, multiplexer-demultiplexers 120, 126. Devices such as switches 140 may in some instances comprise active components. An asymmetric waveguide design may be used to integrate these devices into a monolithic integrated package while also providing for isolation between devices. FIG. 2 provides an illustration of semiconductor optical amplifier 114 that may be suitable for an illustrative asymmetric waveguide embodiment. As shown, optical amplifier 114 comprises a waveguide formed in passive waveguide layer 218 of FIG. 5, which may be a passive waveguide such as a fiber guide, and a second waveguide formed in active waveguide layer 216 formed on top of passive waveguide layer 218. Passive waveguide layer 218 is formed on a substrate (not shown).

In illustrative embodiment of ROADM 110, a first mode of light and a second mode of light are divided unequally between passive waveguide layer 218 and active waveguide layer 216. Waveguide layers 218 and 216 have differing indices of refraction, resulting in the uneven division of light in the regions where the waveguide layers 218 and 216 overlap. In an exemplary embodiment, active waveguide layer 216 has a higher refractive index than passive waveguide layer 218. A first mode of light is confined primarily to passive waveguide layer 218, while a second mode of light is confined primarily to active waveguide layer 216 in the area where the two waveguides overlap. Because the second mode of light, as compared to the first mode, is confined primarily to active waveguide layer 216, the second mode of light is primarily affected by amplifier 114 formed in active waveguide layer 216.

In illustrative structure, amplifier 114 comprises a portion of active waveguide layer 216. The portion of waveguide layer 216 comprised in amplifier 114 may have tapers 213 formed therein for facilitating the transfer of light energy into and out of waveguide layer 216. Tapers 213 may be lateral tapers with exponential or polynomial shapes, but may comprise any geometry, shape, or configuration operable to move light between waveguides. Ridge 215 is formed on waveguide layer 216.

In an illustrative embodiment, active waveguide layer 216 comprises a bulk material of bandgap that both emits and detects light in a wavelength band of interest. Active waveguide 216 may include a plurality of quantum wells separated by a plurality of barrier materials. An intermixed region may be formed in the taper areas 213 wherein the plurality of quantum wells are intermixed with the plurality of barrier materials. In an alternative embodiment, non-intermixed quantum wells may be employed. In an illustrative embodiment, five quantum wells may be embodied in active waveguide layer 216. Amplifier 112 further comprises signal contacts 217 formed thereon for applying a forward bias to the portion of waveguide 216 formed in amplifier 112. Applying the forward bias to active waveguide layer 216 causes light propagating in waveguide 216 to be amplified.

Figure 3:
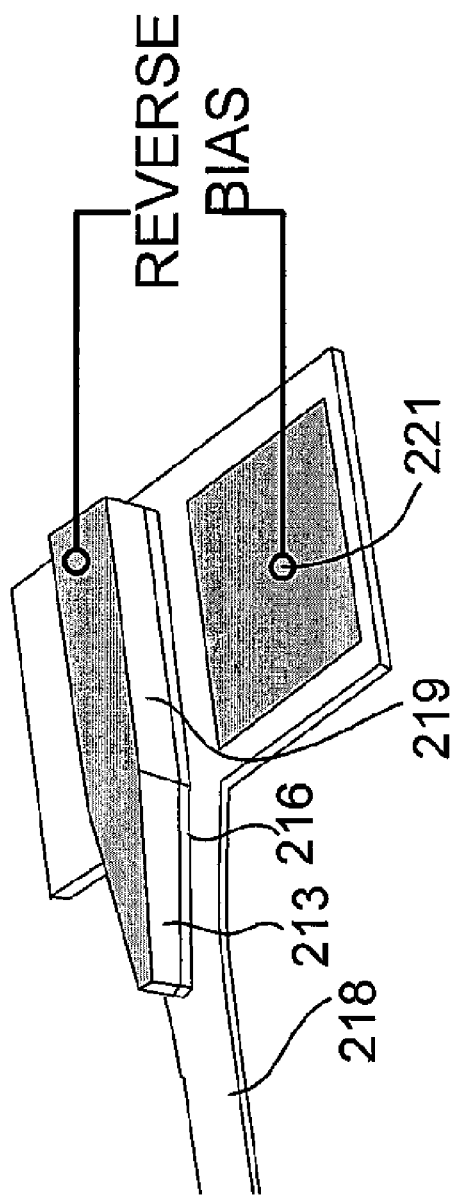
FIG. 3 is a schematic view of an illustrative monolithic integrated detector for use in an illustrative ROADM.

FIG. 3 provides an illustration of detector 150 formed in the layer structure of FIG. 5 that may be suitable for an illustrative asymmetric waveguide embodiment. As shown in FIG. 3, detector 150 comprises a waveguide formed in active waveguide layer 216. The portion of waveguide layer 216 comprised in detector 150 may have a taper 213 formed therein for facilitating movement of light energy into waveguide 216. Ridge 219 is formed on top of waveguide layer 216. As previously mentioned, in an illustrative embodiment, active waveguide layer 216 may comprise a plurality of quantum wells separated by a plurality of barrier materials. Detector 150 further comprises signal contacts 221 for applying a reverse bias to the portion of waveguide layer 216 formed in detector 140. Applying a reverse bias to active waveguide 216 allows for detecting light that is propagating in waveguide 216.

In an illustrative embodiment, amplifier 114 and detector 150, are formed in the same active waveguide layer 216. Forming amplifier 114 and detector 150 in a single active layer 216 in an ATG structure eliminates re-growth steps and thereby simplifies the overall fabrication process of integrated photonic devices.

Figure 4A:
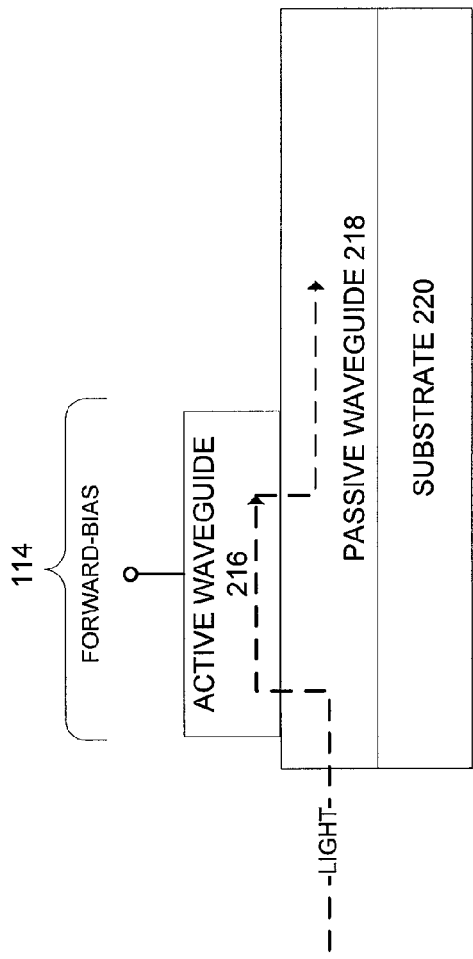
FIG. 4A depicts the movement of light in an illustrative monolithic integrated optical amplifier formed in a waveguide layered structure.
Figure 4B:
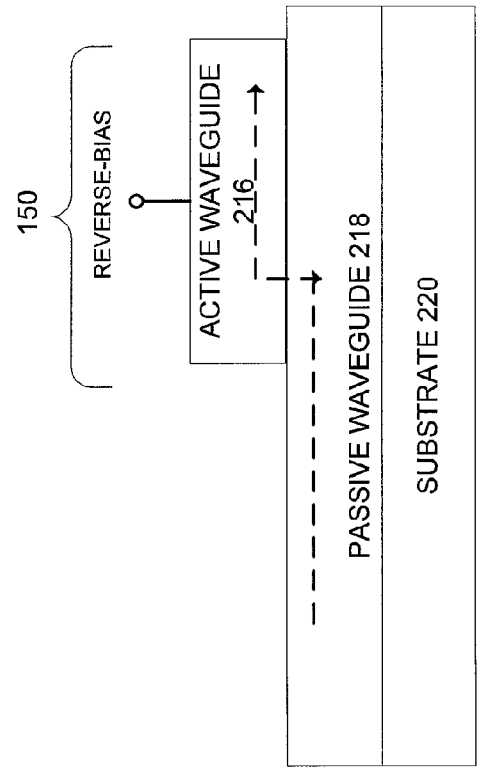
FIG. 4B depicts the movement of light in an illustrative monolithic integrated detector formed in a waveguide layered structure.

FIGS. 4A and 4B illustrates the movement of light energy between waveguide layers in illustrative ROADM 110 in the areas of optical amplifier 114 and detectors 150, respectively. Referring to FIG. 4A, in connection with amplifier 114, light energy, which is depicted using broken lines, enters passive waveguide layer 218 (shown at the left of FIG. 4A) and is coupled into the portion of active waveguide layer 216 that forms amplifier 114. The coupling may be facilitated by a taper 213 formed in waveguide layer 216. While propagating in the portion of waveguide 216 incorporated in amplifier 114, the light energy is amplified as a result of the forward bias applied to active waveguide layer 216. The amplified light energy is coupled back into passive waveguide layer 218.

Referring to FIG. 4B, light energy propagates in passive waveguide layer 218 toward detector 150. The amplified light propagates in passive waveguide layer 218 and is coupled into active waveguide layer 216 beginning in the area where the two overlap. While propagating in the portion of waveguide layer 216 corresponding to detector 150, light energy is absorbed as part of the operation of detector 150 and as a result of the reverse bias applied to active waveguide layer 216. Thus, in the illustrative embodiment, the same waveguide epitaxial structure or layer, active waveguide layer 216, is used for both amplification and detection of light.

FIG. 5 is a diagram depicting material layers comprised in an illustrative embodiment of ROADM structure 110. As shown, structure 110 may comprise cladding and contact layer 234, active waveguide layer 216, passive waveguide layer 218, and insulating or conducting substrate 220.

In an exemplary embodiment, cladding and contact layer 234 comprises a 0.1 µm-thick InGaAs layer, a 1.0 µm-thick InP layer, and a 0.03 µm-thick Q1.2 layer.

Active waveguide layer 216 may comprise, in an exemplary embodiment, five quantum wells separated by barriers, wherein the quantum well-barrier structure is sandwiched between two 0.12 µm-thick Q1.2 layers that are substantially transparent to the movement of light into and out of the waveguide 216. Quantum-well intermixing (QWI), which relies on the mixing of quantum wells and barrier materials of an active region, may be used to reduce absorption loss in the active layers in couplers employing ATG technology. A 0.15 µm-thick InP layer cladding layer is formed between active layer 216 and cladding and contact layer 234. Active devices, i.e. devices that convert electrical energy to optical energy or vice verse, such as optical amplifiers, optical detectors, lasers, an optically activated optical switch, etc., are formed at least in part in the active waveguide layer 216. Often the active devices are those that emit/amplify light and/or absorb light.

Passive waveguide 218 layer may comprise the following: a 0.6 µm-thick InP layer, a 0.195 µm-thick Q1.2 layer, a 0.45 µm-thick InP layer, a 0.18 µm-thick Q1.2 layer, a 0.45 µm-thick InP layer, a 0.165 µm-thick Q1.2 layer, and a 0.5 µm-thick InP layer. In an illustrative embodiment, the multiple layers of passive waveguide 18 are n-doped. Insulating substrate 20 may be a semi-insulating, N-type or P-type InP layer.

In the illustrative embodiment depicted in FIGS. 2 and 3, the forward-biased, i.e., amplifier, and reverse-biased, i.e., detector, regions of active waveguide layer 216 are electrically isolated by the imposition of a gap between the two regions. While the two regions are electrically insulated, light is communicated between the two regions via passive waveguide 218. In another embodiment, electrical insulation between the forward-biased and reverse-biased regions may be provided through means other than a gap such as, for example, by forming an insulating region in active waveguide layer 216 between the forward-bias and reverse-bias. The electrical insulation may be formed, for example, by proton bombardment and/or by ion implantation.

Figure 7:
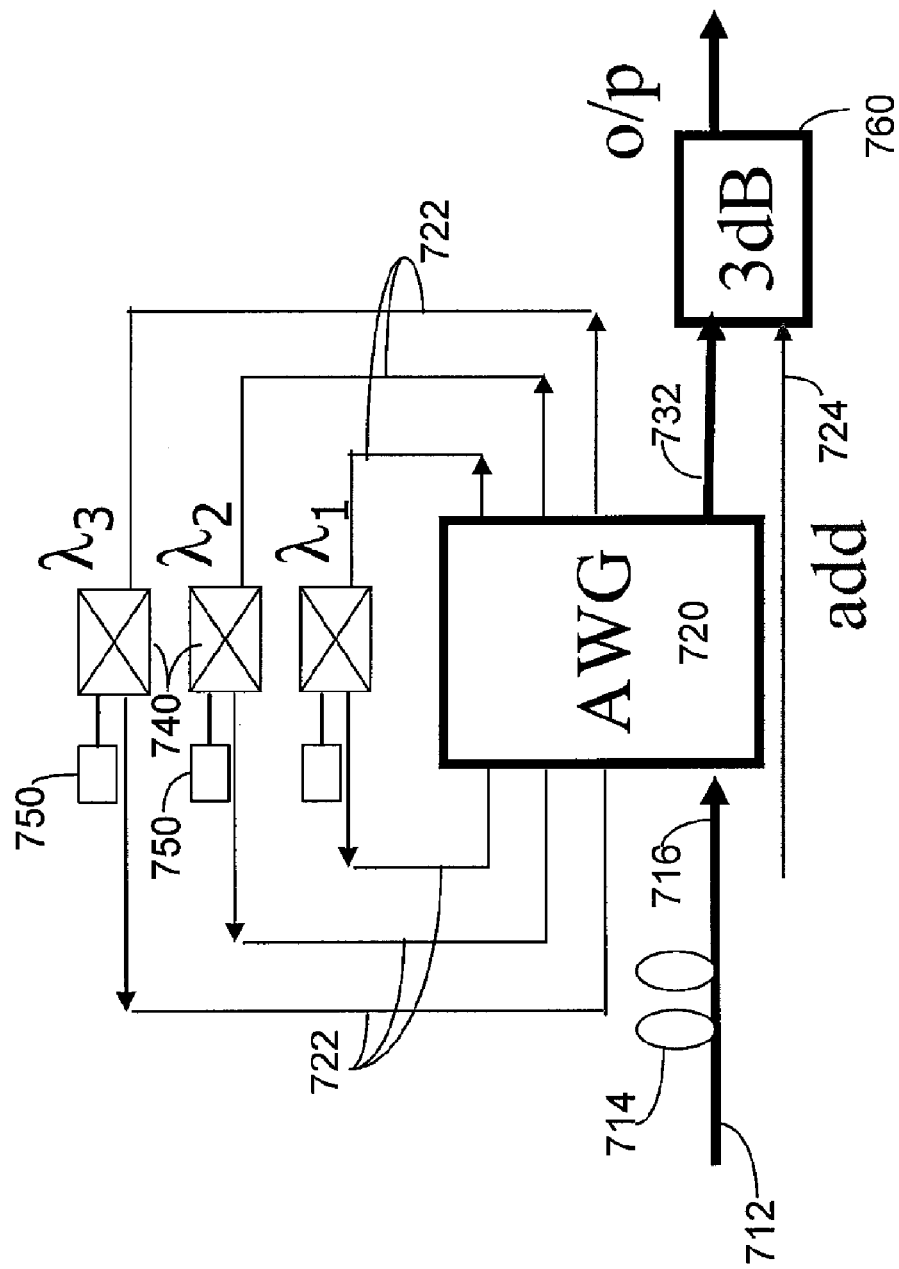
FIG. 7 is a block diagram of an illustrative ROADM.

FIG. 7 is a block diagram of another illustrative ROADM 710. As shown, ROADM 710 comprises an input waveguide 712 for receiving a multiplexed input signal that may comprise a plurality of individual wavelength signals. One, two, three, or any number of individual wavelength signals may be comprised in the input signal. An optical amplifier 714 is communicatively formed with input waveguide 712 and operates to amplify the input signal. A waveguide 716 guides the amplified input signal to multiplexer-demultiplexer 720, which may be, for example, an arrayed waveguide grating. Waveguide 716 may be coupled to multiplexer-demultiplexer 720 using an optical coupler such as, for example, a star coupler.

Multiplexer-demultiplexer 720 is adapted to demultiplex the input signal into the individual wavelength signals that are comprised in the input signal. An optical coupler is employed to route the plurality of individual wavelength signals into a plurality of waveguides 722. Each of the plurality of individual waveguides 722 is adapted to guide one of the plurality of individual wavelength signals from the multiplexed input signal. While only three waveguides 722 are depicted in FIG. 7, any number of waveguides may be employed to handle the plurality of individual waveguide signals that are comprised in the input signal.

Each of waveguides 722 is adapted to guide one of the individual waveguide signals to an optical switch 740. Each of optical switches 740 is adapted to selectively either allow the particular individual waveguide signal in the particular waveguide 722 to continue to propagate in the waveguide where it will eventually propagate to first multiplexer-demultiplexer 720 to be combined in the output signal, or to switch the individual wavelength signal for further processing such as by optical detector 750. Thus, each of optical switches 740 operates to selectively control whether to redirect a particular individual wavelength signal. An individual wavelength signal may be rerouted for any number of reasons such as, for example, monitoring, processing, or otherwise dropping the signal from the ultimate output signal.

Optical switches 740 may be any type of optical switch that is adapted to selectively switch an optical signal to either of two propagation paths. For example, optical switches may be a switch such as that disclosed in the article titled "Compact Polarization-Insensitive InGaAsP—InP 2×2 Optical Switch," 17 *IEEE Photonics Technology Letters* 1 (January 2005), the contents of which are hereby incorporated by reference in their entirety.

Each of optical detectors 750 is adapted to detect an optical signal that has been routed to it by the corresponding optical switch 740. The individual wavelength signals that routed to detectors 750 may be further routed for additional processing.

The individual wavelength signals that are not switched to detectors 750 continue to propagate in waveguides 722. The individual wavelength signals propagate to an optical coupler, and eventually into multiplexer-detector 720. First optical multiplexer-demultiplexer 720 multiplexes the individual wavelength signals into a single signal that may be referred to as an output signal. The output signal is coupled onto output waveguide 732.

ROADM 710 further comprises an add signal waveguide or port 724. Add signal may be a multiplexed signal comprising one or more individual wavelength signals that are meant to be combined with signals comprised in the input signal. Add signal waveguide 724 and output waveguide 732 are communicatively coupled to optical multiplexer/coupler 760. Optical multiplexer/coupler 760 operates to multiplex the individual wavelength signals comprised in the add signal with the signals comprised in the output signal received from multiplexer-demultiplexer 720.

ROADM 710 may be formed in a structure comprising asymmetric waveguide layers similar to that described above in connection with FIG. 5. Thus, active devices—optical amplifier 714 and detector 740—may be formed in an active waveguide layer, while the passive devices—input waveguide 716, multiplexer-demultiplexer 720, waveguides 722, output waveguide 732, and multiplexer/coupler 760—may be formed in a passive waveguide layer. Devices such as switches 740 may be formed in both the active and passive waveguide layers. The active and passive waveguide layers may be formed to have effective indices of refraction so that a first mode of light and a second mode of light are divided unevenly between the layers. Tapers may be used to move light energy between waveguides. The asymmetry between waveguide layers allows for optically isolating the active and passive waveguide components from each other.

Thus, illustrative ROADM structures have been disclosed. The ROADM structures have novel designs and arrangements of components. Furthermore, the illustrative ROADMs may be formed in monolithic integrated structures comprising asymmetric waveguides.

It is noted that the foregoing examples have been provided merely for the purpose of explanation and are in no way to be construed as limiting of the potential embodiments and applications. While the concepts have been described with reference to various embodiments, it is understood that the words which have been used herein are words of description and illustration, rather than words of limitation and that other embodiments are considered suitable. For example, while a particular waveguide layer structure is described above in connection with illustrative embodiments, other structures might also be used. Further, although the novel concepts have been described herein with reference to particular means, materials, and embodiments, the concepts are not intended to be limited to the particulars disclosed herein; rather the concepts extend to all functionally equivalent structures, methods, and uses, such as are within the scope of the appended claims.

What is claimed is:

1. A reconfigurable optical add-drop multiplexer, comprising:
   at least one active optical component operable to convert between electrical energy and optical energy;
   a first multiplexer-demultiplexer communicatively coupled with said at least one active optical component, said first optical multiplexer-demultiplexer adapted to receive an input signal and demultiplex the input signal into a plurality of individual wavelength signals, and adapted to receive a plurality of individual wavelength signals and multiplex the plurality of individual wavelength signals into an output signal;
   a second multiplexer-demultiplexer, said second multiplexer-demultiplexer adapted to receive an add signal and demultiplex the add signal into a plurality of individual wavelength signals;
   a plurality of waveguides, each of the plurality of waveguides communicatively coupled with said first multiplexer-demultiplexer and said second multiplexer-demultiplexer, each of said plurality of waveguides adapted to receive one of the plurality of individual wavelength signals from said first multiplexer-demultiplexer and one of said plurality of individual wavelength signals from said second multiplexer-demultiplexer and communicate the signals to said first multiplexer-demultiplexer; and
   wherein said first multiplexer-demultiplexer, said plurality of waveguides, and said second multiplexer-demultiplexer are substantially formed in a first waveguide layer having a first effective index of refraction,
   wherein said at least one active component is substantially formed in a second waveguide layer, said second waveguide layer optically coupled to the first waveguide layer and having a second effective index of refraction, and
   further wherein said first effective index of refraction and said second effective index of refraction have values causing a first mode of light to propagate primarily in said first waveguide layer and a second mode of light to propagate primarily in said second waveguide layer where the first waveguide layer and second waveguide layer overlap.

2. The reconfigurable optical add-drop multiplexer of claim 1, wherein said at least one active component comprises at least one of an optical amplifier, an optical detector, an optical switch, a laser, a modulator, a resonator, and an attenuator.

3. The reconfigurable optical add-drop multiplexer of claim 1, wherein said at least one active component comprises an optical amplifier operable to amplify an optical signal.

4. The reconfigurable optical add-drop multiplexer of claim 3, wherein said optical amplifier is adapted to receive the input signal, amplify the input signal, and transmit the amplified input signal to said first multiplexer-demultiplexer.

5. The reconfigurable optical add-drop multiplexer of claim 1, further comprising a plurality of optical switches, each of said plurality of optical switches adapted to communicate with one of said plurality of waveguides and adapted to selectively switch an individual wavelength signal from the one of said plurality of waveguides.

6. The reconfigurable optical add-drop multiplexer of claim 1, wherein said optical switch comprises at least one of an optically activated optical switch and an electrically activated optical switch.

7. The reconfigurable optical add-drop multiplexer of claim 5, wherein said at least one active component comprises a plurality of optical detectors, each of said plurality of optical detectors communicatively coupled with one of said plurality of optical switches and adapted to receive one of the individual wavelength signals from one of said plurality of waveguides.

8. The reconfigurable optical add-drop multiplexer of claim 7, wherein said plurality of optical detectors are formed in said second waveguide layer.

9. The reconfigurable optical add-drop multiplexer of claim 8, wherein said optical detector comprises at least one of an avalanche photodetector and a uni-travelling carrier photodetector.

10. The reconfigurable optical add-drop multiplexer of claim 1, further comprising: a first coupler, said first coupler operable to communicate the first input signal into said first multiplexer-demultiplexer and to communicate a plurality of individual wavelength signals into said first multiplexer-demultiplexer, said first coupler further operable to communicate the add signal to the second multiplexer-demultiplexer; and a second coupler, said second coupler operable to communicate a plurality of individual wavelength signals from said first multiplexer-demultiplexer to said plurality of waveguides, said second coupler operable to communicate a plurality of individual wavelength signals from said second multiplexer-demultiplexer to said plurality of waveguides.

11. The reconfigurable optical add-drop multiplexer of claim 1, wherein said first optical multiplexer-demultiplexer comprises an array waveguide grating and said second optical multiplexer-demultiplexer comprises an array waveguide grating.

12. A reconfigurable optical add-drop multiplexer, comprising:
- a first waveguide layer having a first effective index of refraction, said first waveguide having formed therein a first multiplexer-demultiplexer, a plurality of waveguides, and a plurality of optical switches;
- a second waveguide layer optically coupled to the first waveguide and having a second effective index of refraction, said second waveguide layer having formed therein an optical amplifier;
- wherein said optical amplifier is adapted to amplify an input signal and communicate the amplified input signal to said first multiplexer-demultiplexer,
- wherein said first multiplexer-demultiplexer is communicatively coupled with said optical amplifier, adapted to receive the amplified input signal from said optical amplifier and demultiplex the amplified input signal into a plurality individual wavelength signals,
- wherein each of the plurality of waveguides is communicatively coupled with said first multiplexer-demultiplexer, each of said plurality of waveguides is adapted to receive one of the plurality of individual wavelength signals from said first multiplexer-demultiplexer and communicate the signals to said first multiplexer-demultiplexer,
- wherein each of said plurality of optical switches is adapted to communicate with one of said plurality of waveguides and adapted to selectively switch an individual wavelength signal from the one of said plurality of waveguides,
- wherein said first multiplexer-demultiplexer is further adapted to receive a plurality of individual wavelength signals from said plurality of waveguides and multiplex the plurality of individual wavelength signals into an output signal, and
- wherein said first effective index of refraction and said second effective index of refraction have values causing a first mode of light to propagate primarily in said first waveguide layer and a second mode of light to propagate primarily in said second waveguide layer where the first waveguide layer and the second waveguide layer overlap.

13. The reconfigurable optical add-drop multiplexer of claim 12, wherein said second waveguide layer comprises a plurality of optical detectors formed therein, each of said optical detectors communicatively coupled to one of said plurality of optical switches and adapted to detect an individual wavelength signal.

14. The reconfigurable optical add-drop multiplexer of claim 12, wherein said first waveguide layer comprises a second multiplexer-demultiplexer formed therein, said second multiplexer-demultiplexer adapted to receive an add signal, demultiplex the add signal into a plurality of individual wavelength signals, and communicate the plurality of individual wavelength signals to the plurality of waveguides.

15. The reconfigurable optical add-drop multiplexer device of claim 12, wherein said first waveguide layer further comprises an input waveguide and an output waveguide,
- said input waveguide communicatively coupled with said optical amplifier and adapted to receive the input signal and communicate the input signal to said optical amplifier; and
- an output waveguide communicatively coupled with said first multiplexer-demultiplexer and adapted to receive the output signal from said first multiplexer-demultiplexer.

16. The reconfigurable optical add-drop multiplexer of claim 12, wherein said first waveguide layer further comprises a plurality of optical amplifiers, each of said plurality of optical amplifiers integrated with one of said plurality of waveguides, said plurality of optical amplifiers adapted to perform channel equalization.

17. The reconfigurable optical add-drop multiplexer device of claim 14, wherein said first waveguide layer further comprises a first coupler, said first coupler operable to communicate the first input signal into said first multiplexer-demultiplexer and to communicate a plurality of individual wavelength signals into said first multiplexer-demultiplexer, said first coupler further operable to communicate the add signal to the second multiplexer-demultiplexer.

18. The reconfigurable optical add-drop multiplexer of claim 17, wherein said first waveguide layer further comprises a second coupler, said second coupler operable to communicate a plurality of individual wavelength signals from said first multiplexer-demultiplexer to said plurality of waveguides, said second coupler operable to communicate a plurality of individual wavelength signals from said second multiplexer-demultiplexer to said plurality of waveguides.

19. A reconfigurable optical add-drop multiplexer-demultiplexer, comprising:
- an optical amplifier adapted to amplify a multiplexed optical signal comprising a plurality of signals of different wavelengths;
- a multiplexer-demultiplexer communicatively coupled with said optical amplifier, said multiplexer-demultiplexer adapted to demultiplex the multiplexed optical signal into a plurality of individual wavelength signals, said multiplexer-demultiplexer further adapted to receive a plurality of individual wavelength signals and multiplex the received plurality of individual wavelength signals into an output signal;
- a plurality of waveguides, each of the plurality of waveguides communicatively coupled with said multiplexer-demultiplexer, each of said plurality of waveguides adapted to receive one of the plurality of individual wavelength signals from said multiplexer-demultiplexer and communicate one of the plurality of individual wavelength signals to said multiplexer-demultiplexer;
- a plurality of optical switches, each of said plurality of optical switches adapted to communicate with one of said plurality of waveguides and adapted to selectively switch an individual wavelength signal from the one of said plurality of waveguides, wherein said first multiplexer-demultiplexer, said plurality of waveguides, and said plurality of optical switches are formed in a first waveguide layer having a first effective index of refraction, and said optical amplifier is formed in a second waveguide layer, said second waveguide layer optically coupled to the first waveguide layer and having a second effective index of refraction, further wherein said first effective index of refraction and said second effective index of refraction have values causing a first mode of light to propagate primarily in said first waveguide layer and a second mode of light to propagate primarily in said second waveguide layer where the first waveguide layer and second waveguide layer overlap.

20. The reconfigurable optical add-drop multiplexer of claim 19, further comprising:

an add wavelength waveguide adapted to receive an add signal comprising at least one individual wavelength signal; and an optical coupler adapted to communicate with said multiplexer-demultiplexer and said add wavelength waveguide, said optical coupler adapted to multiplex the output signal from said multiplexer-demultiplexer with said add signal from said add wavelength waveguide.

21. The reconfigurable optical add-drop multiplexer of claim 20, wherein said add wavelength waveguide and said optical coupler are formed in said first waveguide layer.

22. The reconfigurable optical add-drop multiplexer of claim 19, further comprising a plurality of optical detectors, each of said plurality of detectors communicatively coupled to one of said plurality of optical switches and adapted to receive an individual wavelength signal.

23. The reconfigurable optical add-drop multiplexer of claim 22, wherein said optical detectors are firmed in said second waveguide layer.

24. The reconfigurable optical add-drop multiplexer of claim 19, further comprising a second optical multiplexer-demultiplexer communicatively coupled with said plurality of waveguides, said second optical multiplexer-demultiplexer adapted to receive an add signal comprising a plurality of individual wavelength signals and demultiplex the add signal into the plurality of individual wavelength signals, wherein said second optical multiplexer-demultiplexer is configured to communicate the plurality of individual wavelength signals from said second optical multiplexer-demultiplexer to said plurality of waveguides.

25. The reconfigurable optical add-drop multiplexer of claim 24, wherein said second optical multiplexer-demultiplexer is formed in said first waveguide layer.

* * * * *